United States Patent
Bernick

[11] Patent Number: 5,736,019
[45] Date of Patent: Apr. 7, 1998

[54] SPUTTERING CATHODE

[76] Inventor: Mark A. Bernick, 1226 Center St. Extension, White Oak, Pa. 15131

[21] Appl. No.: 612,390

[22] Filed: Mar. 7, 1996

[51] Int. Cl.$^6$ .................................................. C23C 14/34
[52] U.S. Cl. .......................... 204/298.07; 204/298.09; 204/298.11; 204/298.14; 204/298.16; 204/298.19; 204/192.12; 204/298.08; 204/298.12
[58] Field of Search .................. 204/298.07, 298.08, 204/298.09, 298.12, 298.14, 298.16, 298.17, 298.18, 298.19, 192.12, 298.11

[56] References Cited

U.S. PATENT DOCUMENTS

| | | | |
|---|---|---|---|
| 3,945,911 | 3/1976 | McKelvey | 204/298.09 |
| 4,094,764 | 6/1978 | Boucher et al. | 204/298.07 |
| 4,100,055 | 7/1978 | Rainey | 204/298.18 |
| 4,169,031 | 9/1979 | Brors | 204/298.19 |
| 4,312,731 | 1/1982 | Morrison, Jr. | 204/298.19 |
| 4,361,749 | 11/1982 | Lord | 204/298.09 |
| 4,434,042 | 2/1984 | Keith | 204/298.19 |
| 4,461,688 | 7/1984 | Morrison, Jr. | 204/298.19 |
| 4,818,358 | 4/1989 | Hubert et al. | 204/298.19 |
| 4,826,584 | 5/1989 | dos Santos Pereiro Ribeiro | 204/298.19 |
| 4,865,708 | 9/1989 | Welty | 204/192.12 |
| 5,174,880 | 12/1992 | Bourez et al. | 204/298.17 |
| 5,180,478 | 1/1993 | Hughes | 204/298.09 |
| 5,259,941 | 11/1993 | Münz | 204/298.09 |
| 5,262,030 | 11/1993 | Potter | 204/298.2 |
| 5,322,605 | 6/1994 | Yamanishi | 204/298.07 |
| 5,399,252 | 3/1995 | Scherer et al. | 204/298.19 |
| 5,407,551 | 4/1995 | Sieck et al. | 204/298.19 |
| 5,415,754 | 5/1995 | Manley | 204/192.12 |
| 5,421,978 | 6/1995 | Schuhmacher et al. | 204/298.09 |
| 5,433,835 | 7/1995 | Demaray et al. | 204/298.09 |

FOREIGN PATENT DOCUMENTS

| | | | |
|---|---|---|---|
| 57-207173 | 12/1982 | Japan | 204/298.19 |
| 2241710 | 9/1991 | United Kingdom | 204/298.19 |

*Primary Examiner*—R. Bruce Breneman
*Assistant Examiner*—Rodney G. McDonald
*Attorney, Agent, or Firm*—Webb Ziesenheim Bruening Logsdon Orkin & Hanson, P.C.

[57] ABSTRACT

A magnetron sputtering electrode for use within a magnetron sputtering device having more uniform cooling of the target with the use of a water chamber including water diverters to establish a turbulent water flow within the water chamber. The electrode also includes a direct power coupling to the cathode body to avoid degradation of the power supplied to the electrode. The electrode further includes introduction of process gas in an interstitial space between the anode shield and the cathode shield. The electrode also includes the use of removable shaped magnets providing improved target utilization and run times and a choice of erosion pattern and balanced or unbalanced sputtering by simple magnet substitution. In one embodiment, the invention includes the use of a threaded anode shield and a threaded cathode shield which significantly reduces the overall electrode size for a given target diameter.

27 Claims, 4 Drawing Sheets

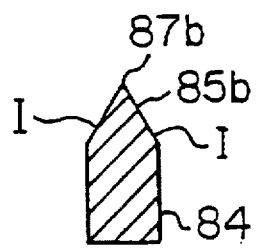
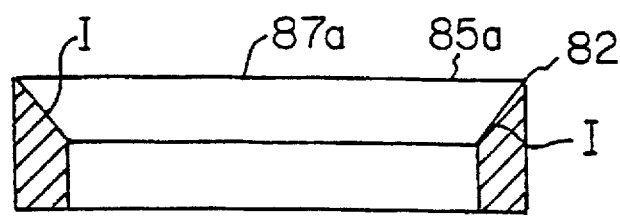
FIG. 9A  FIG. 9B
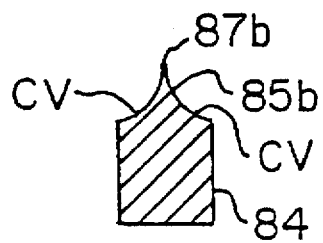
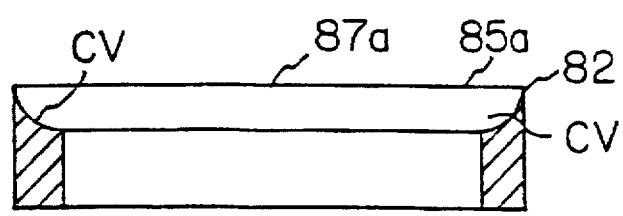
FIG. 10A  FIG. 10B
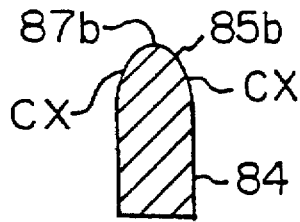
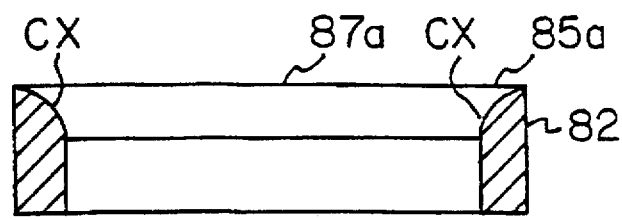
FIG. 11A  FIG. 11B

SPUTTERING CATHODE

FIELD OF THE INVENTION

The present invention relates to the field of vacuum sputter coating apparatus and particularly relates to an improved sputtering process and apparatus, and more particularly still to the construction of an improved cathode/anode assembly which provides faster deposition rates, better uniformity in the material deposited and longer lasting targets which in turn permit longer run times between periods of downtime.

DESCRIPTION OF THE PRIOR ART

The present invention is directed to an improved magnetron sputtering apparatus. A typical magnetron sputtering device includes a vacuum chamber having an electrode contained therein, wherein the electrode includes a cathode portion, an anode portion and a target. A vacuum is drawn in the vacuum chamber followed by the introduction of a process gas into the chamber. Electrical power supplied to the electrode produces an electronic discharge which ionizes the process gas and produces charged gaseous ions from the atoms of the process gas. The ions are accelerated and retained within a magnetic field formed over the target, and are propelled toward the surface of the target which is composed of the material sought to be deposited on a substrate. Upon striking the target, the ions dislodge target atoms from the target which are then deposited upon the substrate. By varying the composition of the target, a wide variety of substances can be deposited on various substrates. The result is the formation of an ultra-pure thin film deposition of target material on the substrate.

What is termed the electrode above (which includes both a cathode portion and anode portion) is sometimes simply called a cathode by those skilled in the art. While the inventor recognizes that convention, the discussion below does not follow this convention because calling the electrode a cathode will only cause confusion in the following discussion which discusses separately the cathode and anode portions of the electrode.

Several problems exist with respect to known magnetron sputtering devices.

First, the sputtering process produces intense heat. In order to prolong the life of both the target and the sputtering device, the sputtering cathode, particularly the area behind the target, is typically cooled with water. In the known prior art sputtering devices, water simply enters a water chamber associated with the cathode and circulates around the circumference of the water chamber, and exits the water chamber. This method and apparatus for cooling the cathode is not particularly effective, and provides a significant limitation on the prior art magnetron sputtering devices because the power supplied, and in turn, deposition rates, must be held at a reduced level to avoid overheating the cathode assembly. Alternatively, if the power supplied exceeds this threshold, at substantially high operating temperatures due to inefficient cooling, cracks will form in highly stressed target materials, such as ceramics and brittle metals. Also, the heat buildup causes higher electrical resistance which impedes the flow of electrons which yields lower deposition rates than would otherwise have been possible if such heat were not present.

Typically in the prior art, an electrical power cable was attached to the water chamber base plate, and an electrical circuit to a cathode body traveled from the base plate, through the water chamber sidewalls to the cathode body. The interface of base plate and sidewall, while sealed with an o-ring seal, still resulted in the formation of corrosion and poor electrical contact degrading the electrical circuit due in part to an oxidation buildup at the base plate/sidewall interface. This resulted also in unsteady process parameters and difficulty in obtaining RF matching.

Targets of the prior art are typically held within or adjacent to the electrode by one or more target clamps. In the prior art such clamping mechanisms were quite bulky, resulting in a much larger diameter electrode than would have otherwise been necessary to accommodate the bulky clamping mechanism. Further, prior art clamping mechanisms are not able to adjust to a wide range of target thicknesses and many involved the use of small screws to hold the clamping mechanism in place, which screws were difficult to start, and easy to strip and/or lose.

Further, in electrodes of the prior art, an anode shield was employed which was also bulky in design, also resulting in a much larger overall size than the given target area. Typically, the prior art anode shield was fixed to a water chamber base plate, and a clamping mechanism was attached at the opposite end with screws or welds to provide an anode shield. Further, the anode-to-cathode spacing was fixed and not adjustable. A smaller overall size is desirable because for a given target size it permits closer proximity of the cathode to the substrate, which yields more uniform depositions on the substrate. The lack of welds is desirable, as welds can cause fluctuations in the magnetic fields which is undesirable. Eliminating the screws permits smaller overall dimensioning and eliminates the starting, stripping and/or misplacement of screws.

Prior art electrodes were maintained in a gas chamber, in which a process gas was injected which could then be ionized. Higher gas pressures and more volume of gas were required than were truly necessary because the ionizing gas was really necessary only over the target area, and not within the entire chamber. An additional limitation with the prior art electrodes included the fact that the use of higher volumes of gas also resulted in a higher ratio of gas inclusions and defects on the substrate during the coating operation, resulting in films with less than desired uniformity.

Prior art magnets were comprised of a series of separate individual magnetic pieces. These individual magnetic pieces resulted in magnetic field fluctuations between the pieces, which resulted in less than uniform magnetic fields and an inefficient use of the target area because the magnetic field was not sufficiently uniform to use all or nearly all of the target area.

In addition, the use of individual magnetic pieces further required the use of an additional device known as a magnetic "shaping ring" that increased the size and cost of the electrode. This ring, placed between the magnets and the target area, functioned in the prior art to shape and unify the magnetic field. However, it also weakened the field in doing so, and moved the magnets further away from the target.

Elimination of the shaping ring would permit a much closer target-to-magnet distance which would allow more magnetic field to "passivate" or flow through the target area, and the stronger magnetic field would permit much higher deposition rates and greater plasma density. Plasma density here refers to the number of gaseous ions retained within the magnetic field. The higher the field strength, the fewer gaseous ions can escape the magnetic field, or conversely, the more ions are retained within the field. Increasing the number of ions within the magnetic field is referred to as increasing the plasma density. With increased plasma density higher power can be supplied, allowing higher deposition rates.

In addition to increasing the target-to-magnet distance, the magnetic shaping ring has the additional disadvantage of "soaking up" or dissipating the magnetic field which reduces the strength of the overall magnetic field. The weaker magnetic field permits the undesirable consequence of the escape of both gaseous ions and secondary electrons from the magnetic field. Secondary electrons are created during the ionizing process when the gaseous atom is ionized to form the gaseous ion and accompanying secondary electrons according to standard charge balancing theory.

Importantly, the presence of the magnetic shaping ring substantially limited the prior art's ability to sputter magnetic materials to only very thin magnetic materials such as foils and the like on the order of 3 to 7/1000ths in thickness. Certainly, targets having the standard target thickness of approximately ⅛ to ¼ inch could not be composed of magnetic material in the prior art due to the presence of the magnetic shaping ring. Magnetic materials could not be sputtered for three reasons. First, the magnetic shaping ring forced a larger target-to-magnet distance as described above weakening the magnetic field over the target area. It should be noted that with each incremental increase in target-to-magnet distance, the magnetic field was reduced two times in strength, and therefore minor differences in target-to-magnet distances resulted in significant field strength loss. Second, the magnetic shaping ring soaked up part of the magnetic field itself, as described above. Finally, the magnetic target material shunted whatever magnetic field strength was left over the target area. For most applications, at least 300 gauss field strength was needed over the target area, with higher field strengths being desired as described above. With prior art electrodes utilizing non-magnetic target materials, this threshold could be reached. However, when magnetic target materials were substituted for the non-magnetic materials, this threshold could not be reached unless the magnetic target material was very thin, in the nature of a foil as described above.

In the prior art, simple rectangular magnets were used. These rectangular magnets resulted in magnetic flux lines which tended to "dig out" the target area in a rather steep valley-like formation exhibiting a steep erosion profile in the magnetic null point area. The target area would rapidly wear thin in the null point area, but much target material remained that was therefore not utilized outside of this area. This also resulted in much shorter process run times, as the target would wear more quickly and the process would have to stop while the target was being replaced.

A need exists in the art for a magnetron sputtering device and process for sputtering wherein the sputtering electrode is more efficiently and effectively cooled, and wherein electrical connections are not susceptible to degradation due to oxide formations. Further, a need exists in the art for a magnetron sputtering device and process for sputtering wherein the overall electrode size relative to target area is reduced and wherein both the anode and cathode shields are easily adjusted and wherein the target area is easily retained and replaced, and wherein the anode-to-cathode spacing may be adjusted. A need also exists in the art for a magnetron sputtering device and process for sputtering wherein a minimum of ionizing gas is used. Finally, the need exists in the art for a magnetron sputtering device and process for sputtering wherein the magnetic shaping ring can be eliminated and wherein targets of standard thicknesses such as ⅛ to ¼ inch in cross section composed of magnetic materials can be sputtered.

SUMMARY OF THE INVENTION

The foregoing needs and others are addressed in the present invention which comprises a magnetron sputtering device and process for sputtering which includes several improvements over the magnetron sputtering devices of the prior art, as detailed below.

These improvements apply equally to magnetron sputtering devices employing either linear targets or circular targets, unless otherwise noted or apparent. Linear targets include generally rectangular or square targets. It is common that linear targets are utilized in commercial applications to obtain deposition over a wide surface area, whereas circular targets are commonly used in research applications, although both are used commercially and in research applications.

In a first improvement, the electrode of the magnetron sputtering device is more efficiently cooled over electrodes of the prior art by forcing cooling water around a central water director in the water chamber to create a turbulent water flow in the water chamber. The water cools more quickly and efficiently, eliminating stress cracks in the ceramic targets and permitting higher power to be used to provide higher deposition rates due to the improved cooling.

In a second improvement, electrical power connections are rendered impervious to oxidation degradation by direct power coupling of the electrical connection to the cathode body. In particular, the electrical connection is provided through the base plate, through the water chamber and directly to the cathode body of the electrode. Oxidation buildup at the base plate/sidewall interface does not affect the electrical connection.

In a third improvement applicable to magnetron sputtering devices employing circular targets, the target clamp is fully adjustable, permitting targets of varying thickness to be easily installed and replaced in the electrode. In particular, the target clamp for circular targets of the present invention is of a generally tubular design having internal threads which threadably engage threads in the exterior wall of the water chamber. Advantages, in addition to reducing the size of the overall electrode by eliminating bulky clamps and screws to affix the target to the electrode, include that the target clamp adjusts quickly and easily to a wide range of target thicknesses and there are no small screws to start, strip and/or lose.

In a fourth improvement, the improved electrode of the present invention has a significantly small overall dimensional size for the same size target area as electrodes of the prior art. Particularly with respect to circular targets, this is due to the adjustable target clamp discussed above and to the threaded anode shield discussed below. This smaller overall dimension for the same target size permits closer proximity which yields more uniform depositions on a substrate.

In a fifth improvement, particularly applicable to magnetron sputtering devices employing circular targets, the anode shield is generally tubular in shape and includes a threaded portion on its interior portion, which threadably engages the base plate on threads about the exterior circumference of the base plate. Advantages with this improvement include the smaller overall dimensions discussed above, and an infinitely adjustable anode-to-cathode spacing that allows any thickness of target material to be sputtered. This was not possible with the prior art electrodes.

In a sixth improvement, the anode shield of the present invention contains none of the welds or screws that were associated with the clamping mechanisms of the prior art discussed above. As noted above, eliminating the screws permits smaller overall dimensioning and eliminates the starting, stripping and/or misplacement of screws. Further, the lack of welds is desirable, as welds can cause fluctuations in the magnetic field which yields deviation in the coating uniformity of the coating formed on the substrate.

In a seventh improvement, a gas inlet is provided, in which the gas to be ionized, known as the process gas, is injected into the electrode in the interstitial space between the anode shield and the cathode body. The injected process gas flows throughout the interstitial space and flows over the target area from a 360 degree circumference. Advantages of this embodiment include the use of a lower gas pressure in the chamber, less process gas inclusions and better film uniformity because the process gas flows directly over the target area where it is needed for ionization.

In an eighth improvement, the separate individual magnets of the prior art have been replaced with a single magnet of a solid tube-like structure or rectangular structure, depending upon whether the device utilizes a circular or linear target respectively. Advantages include a much more uniform field, and more target utilization. In addition, the use of the solid magnet permits elimination of a magnetic "shaping ring" that was required in the prior art.

In a ninth improvement, the simple magnets of the prior art are replaced by shaped magnets which produce a magnetic field flux line over the target area which is much wider than that of the prior art. The wider flux line produces an erosion pattern of the target surface during sputtering that results in a greatly "flattened" valley, in which much more target area is utilized, as opposed to the steeply sided "crevice-like" erosion pattern of the prior art, which used only a small portion of the target area, resulting in much waste of target material. The present invention also results in longer process run times because the flattened valley erosion pattern of the target takes much longer to burn through the target than did the prior art crevice-like erosion pattern which burned through a small area in very short order. The longer lasting target of the present invention does not have to be replaced as often resulting in the longer run times described. The particular shape of the shaped magnets of the present invention is discussed below.

Finally, in a tenth improvement, the magnetic "shaping ring" is eliminated. Elimination of the shaping ring with the present invention permits a much closer target-to-magnet distance which allows more magnetic field to passivate the target area resulting in higher deposition rates as described above. There is less secondary electron heating of the substrate and low pressure sputtering is facilitated. Importantly, elimination of the sputtering ring permits the present invention to effectively sputter magnetic materials of standard or typical target thicknesses on the order of ⅛ to ¼ inch, which was not possible in the prior art.

More particularly, the present invention is directed to a magnetron sputtering electrode for use within a magnetron sputtering device for coating a substrate with a material sputtered from a target composed of the material, the electrode comprising:

a target, the target having a front sputtering surface, a body and a back surface;

a cathode body located adjacent the back surface of the target;

a device for retaining the target adjacent to the cathode body, the device for retaining the target adjacent to the cathode body also functioning as a cathode shield;

an insulator plate, the insulator plate having a front surface, a body and a back surface wherein the cathode body cooperates with the front surface of said insulator plate to form a watertight water chamber wherein the water chamber includes a top and sides bounded by the cathode body and a bottom bounded by the insulator plate;

a first magnet within the water chamber selected from the group consisting of an annular magnet and a perimeter magnet;

a second magnet within the water chamber, wherein the second magnet is a center magnet and is disposed within the perimeter of the first magnet, wherein the first and second magnets are located adjacent to the cathode body which is in turn located adjacent the back surface of the target, the first and second magnets cooperating to generate magnetic flux lines which form a closed-loop magnetic tunnel adjacent to said front sputtering surface of the target;

a base plate adjacent the back surface of insulator plate wherein the base plate is electrically insulated from the cathode body by the insulator plate;

an anode shield associated with the base plate wherein the anode shield surrounds and contains within the target, the cathode shield, the cathode body, the water chamber and the insulator plate;

a water inlet for introducing cooling water into the water chamber;

a water outlet for removing cooling water from the water chamber, wherein the water inlet and the water outlet cooperate to form a constant flow of cooling water within the water chamber;

a plurality of water diverters within the water chamber wherein the water diverters provide a turbulent water flow within the water chamber to provide uniform cooling within the water chamber which in turn provides uniform cooling of the target;

a power source for applying a voltage to the cathode body; and wherein the electrode does not include a magnetic shaping ring.

In an alternative embodiment, the present invention includes a magnetron sputtering electrode for use within a magnetron sputtering device for coating a substrate with a material sputtered from a target composed of the material, the electrode comprising:

a circular target, the target having a front sputtering surface, a body and a back surface;

an annular cathode body located adjacent the back surface of the target, the cathode body including threads on the exterior surface of said cathode body;

an annular clamping ring including threads on the interior surface of said clamping ring, wherein the clamping ring retains the target adjacent the cathode body by threadably engaging the interior threads of the clamping ring with the exterior threads of the cathode body wherein clamping ring functions as a cathode shield;

a circular insulator plate, the insulator plate having a front surface, a body and a back surface wherein the cathode body cooperates with the front surface of said insulator plate to form a watertight water chamber wherein the water chamber includes a top and sides bounded by the cathode body and a bottom bounded by the insulator plate;

a first annular magnet within the water chamber;

a second cylindrical magnet within the water chamber, wherein the second magnet is a center magnet and is disposed within the perimeter of the first magnet, wherein the first and second magnets are located adjacent to the cathode body which is in turn located adjacent the back surface of the target, the first and second magnets cooperating to generate magnetic flux lines which form a closed-loop magnetic tunnel adjacent to said front sputtering surface of the target;

a circular base plate adjacent the back surface of the insulator plate wherein the base plate is electrically insulated from the cathode body by the insulator plate, the base plate further including threads on the exterior surface of the base plate;

an annular anode shield associated with the base plate wherein the anode shield includes threads on the interior surface of the anode shield and wherein the anode shield is associated with the base plate by threadably engaging the threads on the interior surface of the anode shield with the exterior threads on the base plate, wherein the anode shield surrounds and contains within the anode shield the target, the cathode shield, the cathode body, the water chamber and the insulator plate;

a water inlet for introducing cooling water into the water chamber;

a water outlet for removing cooling water from the water chamber, wherein the water inlet and the water outlet cooperate to form a constant flow of cooling water within the water chamber;

a plurality of water diverters within the water chamber wherein the water diverters provide a turbulent water flow within the water chamber to provide uniform cooling within the water chamber which in turn provides uniform cooling of the target;

a power source for applying a voltage to the cathode body; and wherein the electrode does not include a magnetic shaping ring.

BRIEF DESCRIPTION OF THE DRAWINGS

FIGS. 9A, 9B, 10A, 10B, 11A and 11B are sectional elevational views of magnets having profiles made in accordance with the present invention.

DETAILED DESCRIPTION OF THE INVENTION

Figure 1:
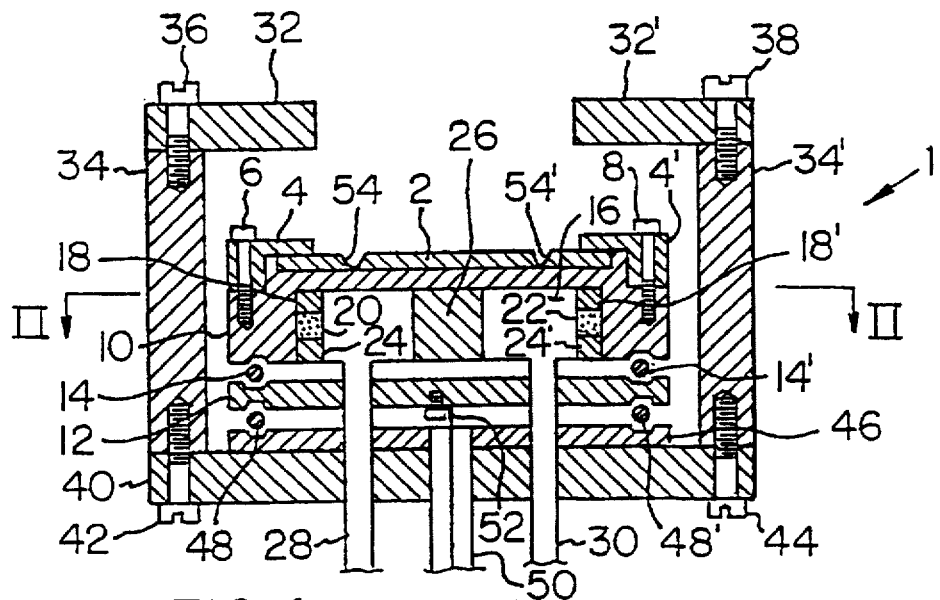
FIG. 1 is a sectional side view of a typical electrode assembly of a magnetron sputtering device of the prior art.

It should be noted at the outset that FIGS. 1–6B are drawn only generally and conceptually, and are not drawn precisely to scale. Further, it should be noted that like elements bear the same reference numeral in the different figures in which such like elements appear.

Also, as noted above, these improvements of the present invention apply equally to magnetron sputtering devices employing either linear targets or circular targets, unless otherwise noted or apparent. Linear targets include generally rectangular or square targets. It is common that linear targets are utilized in commercial applications to obtain deposition over a wide surface area, whereas circular targets are commonly used in research applications, although both are used commercially and in research applications.

FIG. 1 is directed to a prior art magnetron sputtering device utilizing a circular target, but unless specifically noted or otherwise clear from the context of the discussion, the elements of the present invention are equally applicable to such devices utilizing a linear target as well.

As shown in FIG. 1, the electrode 1 of the prior art includes circular target 2 which is generally in the form of a flat disk, which is held in place by a clamping ring. The clamping ring is in the form of a flat ring or circular band, and when shown in section as in FIG. 1, will seem to appear as two separate elements 4 and 4', when in fact what is seen in FIG. 1 are the two ends of the clamping ring after sectioning. For purposes of the following discussion, the clamping ring will be referred to as clamping ring 4, but it is to be understood that this includes elements 4 and 4'.

Clamping ring 4 is in turn affixed via a plurality of screws about the circumference of clamping ring 4 as represented by screws 6 and 8 respectively to the top of cathode body 10. Cathode body 10 in turn is associated with sealing plate 12, and a water tight seal is formed therebetween via an o-ring which includes elements 14 and 14' when sectioned for the same reason as explained above with respect to elements 4 and 4', and similarly will be referred to hereinafter as o-ring 14.

A water chamber 16 is formed and bounded by the interspace between cathode body 10 and sealing plate 12. Located within water chamber 16 is a magnetic assembly which is complex to manufacture, and is typically formed of a magnetic shaping ring, several individual magnets, a base ring, a polymeric material interposed between the magnetic shaping ring and the base ring in which the individual magnets are embedded, and a center magnet which is also embedded in the polymeric material.

The magnetic field shaping ring is shown in FIG. 1 as comprising elements 18 and 18' when sectioned, which shall be referred to hereinafter as magnetic shaping ring 18. The plurality of magnets are shown in phantom in FIG. 1 as magnets 20 and 22. The individual magnets are embedded within the wall of a material, which is typically a polymer, which is interposed between magnetic shaping ring 18 and the base ring and is the reason the magnets 20 and 22 are shown in phantom. The base ring is shown in FIG. 1 as elements 24 and 24' when sectioned shall be referred to hereinafter as base ring 24. The central magnet 26 is also shown in FIG. 1, generally centered within magnetic shaping ring 18.

Magnetic field shaping ring 18 is shown interposed between target 2 and the plurality of individual separate magnets represented by magnets 20 and 22 in FIG. 1. Magnetic field shaping ring 18 shapes the magnetic field produced by the individual magnets represented by magnets 20 and 22 to form magnetic flux lines as discussed below.

Cooling water enters water chamber 16 via water inlet supply 28 and exits water chamber 16 via water outlet 30.

Electrode 1 further includes a ring-shaped anode shield which includes elements 32 and 32' when sectioned which will be hereinafter referred to as anode shield 32. Anode shield 32 is affixed about its circumference to a tubular anode shield support which comprises elements 34 and 34' when sectioned, and shall be referred to hereinafter as anode shield support 34. Anode shield support 34 is affixed via a plurality of screws about its circumference as represented by screws 36 and 38 respectively. Anode shield support 34 is affixed about its circumference to a base plate 40 via a plurality of screws as represented by screws 42 and 44 respectively.

Interposed between base plate 40 and sealing plate 12 is an insulating plate 46 which electrically insulates cathode body 10 and sealing plate 12 from base plate 40. A water tight seal is maintained between insulating plate 46 and sealing plate 12 by an o-ring interposed between, which as shown in FIG. 1, includes elements 48 and 48' when sectioned, and which will be referred to hereinafter as o-ring 48.

Electric current is supplied to cathode body 10 via power cable 50 which is affixed to sealing plate 12 via screw 52. Sealing plate 12 in turn carries the electrical current to cathode body 10 over the interface of cathode body 10 with sealing plate 12 in the vicinity of o-ring 14. Over a period of time, the interface of cathode body 10 and sealing plate 12 is subject to corrosion which significantly and negatively interferes with the flow of electrical current to cathode body 10, significantly and negatively affecting the operation of the electrode 1.

The steep-valley ring-like erosion pattern of electrodes of the prior art is shown in FIG. 1 as elements 54 and 54' when sectioned, and hereinafter referred to as erosion pattern 54.

Figure 2:
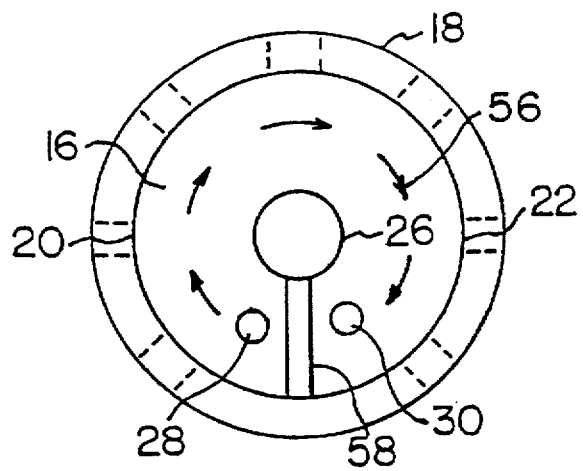
FIG. 2 is a sectional plan view of the water chamber of the prior art along the line A—A of FIG. 1.

FIG. 2 provides a sectional plan view of magnet assembly along the line A—A in FIG. 1. Shown in FIG. 2 is magnetic shaping ring 18. Also shown in phantom are a plurality of individual magnets as represented by magnets 20 and 22, embedded within the polymeric wall material. Water or other cooling fluid enters water chamber 16 via water inlet 28 and exits water chamber 16 via water outlet 30 as shown in FIG. 1. The water flows within water chamber 16 in the direction shown by arrows 56 about the circumference of water chamber 16 due to the placement of diverter 58 and magnet 26 within water chamber 16.

Figure 3A:
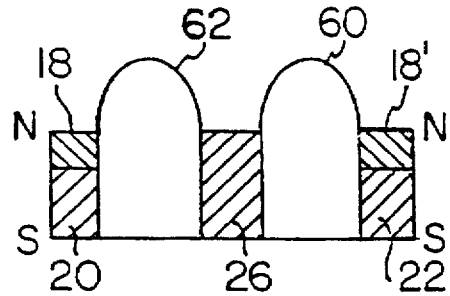
FIG. 3A is a sectional side view of the magnetic field flux lines of the individual magnets of FIG. 2.
Figure 3B:
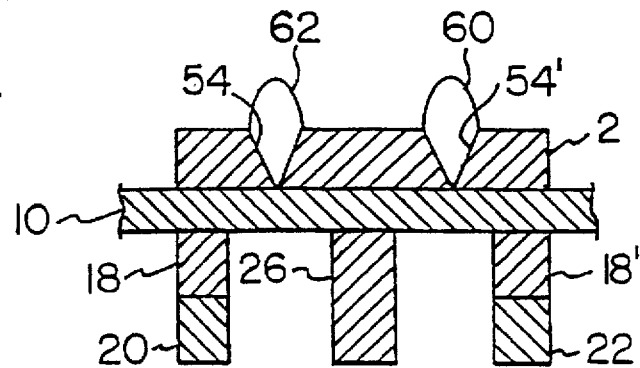
FIG. 3B is a sectional side view of the target utilization pattern which accompanies the field flux lines of FIG. 3A.

FIG. 3A provides a sectional side view of the prior art's magnetic shaping ring 18 and the magnetic field flux lines 60 and 62 produced by the cooperation of magnetic field shaping ring 18 and individual magnets 20, 22 and 26. FIG. 3B provides a sectional side view similar to that of FIG. 3A, with the addition of target 2 and a portion of cathode body 10, and shows the prior art's crevice-like erosion pattern 54 of target 2 from the magnetic flux lines 60 and 62 produced by the cooperation of individual magnets 20, 22 and 26, and magnetic field shaping ring 18.

Figure 4:
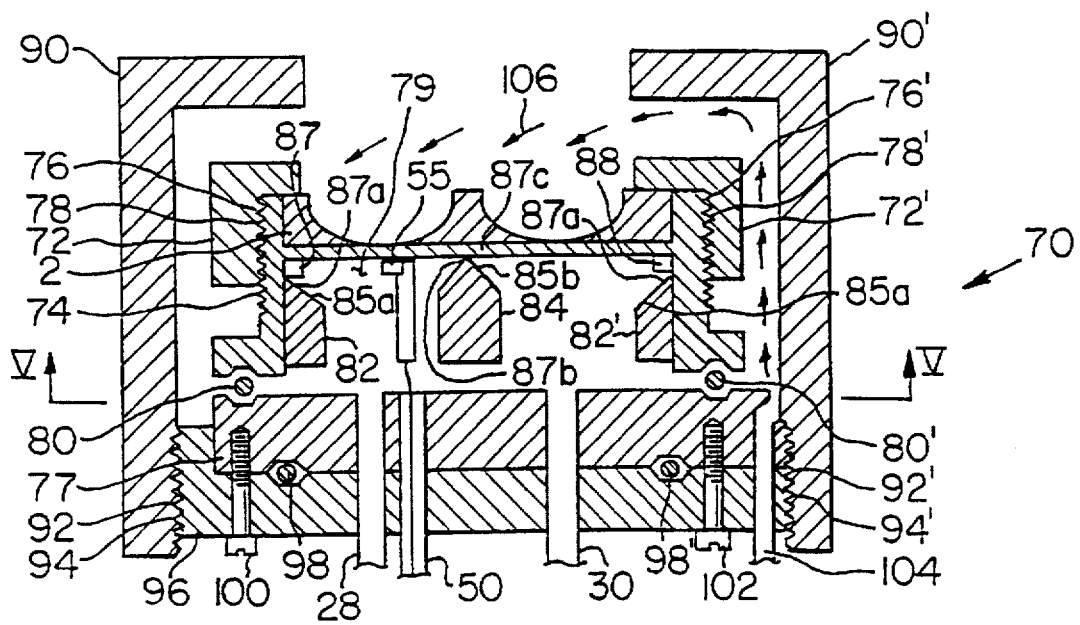
FIG. 4 is a sectional side view of the electrode assembly of the magnetron sputtering device of the present invention.

FIG. 4 provides a sectional side view of the electrode 70 of the present invention, which includes target 2. Target 2 is held in place by an annular or ring-shaped target clamping ring, which is shown in FIG. 1 as including elements 72 and 72' due to sectioning (as described above with respect to elements 4 and 4'), and which will be referred to hereinafter as clamping ring 72. Clamping ring 72 also functions as a cathode shield.

More particularly, target 2 is held in place by being held against cathode body 74 by clamping ring 72 when clamping ring 72 is threaded via clamping ring threads, shown as clamping ring threads 76 and 76' due to sectioning and hereinafter referred to as clamping ring threads 76, on mating cathode body threads, shown as cathode body threads 78 and 78' due to sectioning and hereinafter referred to as cathode body threads 78. The cathode body 74 and clamping ring 72 define a target receiving recess having a depth and is adapted to receive targets 2 having varying thicknesses. The interspace between target clamping ring 72 and the top of cathode body 74 which retains target 2 is variable simply by turning clamping ring 72 and causing clamping ring threads 76 on the interior circumference of clamping ring 72 to travel a greater or lesser distance along cathode body threads 78 located on the exterior circumference of cathode body 74. This also allows for easy removal and replacement of target 2, and further, easily accommodates interchanging target 2 with other targets having different thicknesses.

Cathode body 74 cooperates with insulator plate 76 shown in FIG. 4, to form water chamber or magnet receiving chamber 78, which is made water tight via an o-ring seal interposed therebetween. The o-ring seal is shown in FIG. 4 as elements 80 and 80' due to sectioning, but simply constitute a single o-ring which will hereinafter be referred to as o-ring 80.

Contained within water chamber 78 is an annular or ring-shaped magnet which is shown as elements 82 and 82' due to sectioning, which will be referred to hereinafter as ring magnet 82. The top of shaped ring magnet 82 includes an inclined plane sloping downwardly and inwardly as shown in FIG. 4. Also contained within water chamber 78 is center magnet 84 which is generally cylindrical in form except for the top of magnet 86 which, like a pencil point, includes a downwardly and outwardly sloped inclined plane, also as shown in FIG. 4. Magnets 82 and 84 include tips 85a and 85b each having apexes 87a and 87b, respectively, which are positioned adjacent a target supporting surface 87c of the cathode body 74. The ring magnet 82 defines a hollow center and the center magnet 84 is positioned within the hollow center.

While shown in FIG. 4 as a simple inclined plane, it is to be understood that the inclined planes of ring magnet 82 and center magnet 84 may be made slightly concave or convex. FIGS. 9A, 9B, 10A, 10B, 11A and 11B disclose cross sections of tips 85a and 85b defining a line that extends from the respective apexes which are either inclined I, concaved CV or convexed CX. The shaping of the ring magnet 82 as a simple inclined plane, or as a concave or convex inclined plane will cause the magnetic flux lines to travel along different paths. The shaped magnets of the present invention represent an important advance over the prior art as the shaping permits the magnets to be designed to provide for steep erosion patterns to permit rapid deposition or for significantly flattened erosion patterns for slower, but longer lasting use of the target material. Where the target material is cheap and plentiful, and/or the speed of deposition is important, the shaped magnets of the present invention can provide flux lines which result in steep erosion patterns. Where the target material is expensive, the flattened erosion pattern will permit much more use of the target before the target must be replaced. In particular, convex inclined planes result in a higher field resulting in an erosion pattern that is steeper, whereas concave inclined planes result in lower, flatter fields resulting in more use of the target material and more uniform deposition.

It is a further advantage of the present invention, that the use of a shaped ring magnet and the threaded cathode and anode shields permits quick and easy interchange of the ring magnet 82 and center magnet 84, permitting the user to choose a desired sputtering erosion pattern quickly and easily. This is in direct contrast to the prior art magnet assembly which required several discreet magnets embedded in a polymer matrix and bounded by a shaping ring and base ring, wherein it was not possible to easily interchange only the magnets as opposed to the entire assembly.

Easy interchange of the magnets provides another advantage over the prior art, permitting the electrode of the present invention to be easily and quickly converted from balanced sputtering to unbalanced sputtering. In balanced sputtering, the magnetic field is balanced over the target area causing the gaseous ions which have greater mass and operate for the most part to be retained within the magnetic field and to dislodge the target atoms. Similarly, in balanced sputtering, the secondary electrons, which despite lower masses, also help to dislodge target atoms, are retained within the magnetic field. In balanced sputtering, escape of the secondary electrons is undesirable because they can impact upon and heat the substrate. In contrast, in unbalanced sputtering, it is desirable for at least a portion of the secondary electrons to escape the magnetic field and impact upon the substrate, as where, for example, it is desirable to have the substrate heated during the sputtering process. The change from balanced to unbalanced sputtering can be easily accomplished with the present invention simply by making the center magnet 84 and/or ring magnet 82 have greater or lesser mass or more or less magnetic field strength.

Also shown in FIG. 4 within water chamber 78 are spacers 86 and 88 which function to permit a small space between ring magnet 82 and cathode body 74 so that cooling water will flow completely around ring magnet 82. These spacers are not at all on the order of size of the magnetic shaping ring, being much smaller, generally on the order of 1/16 inch thick.

Electrode 70 further includes a ring-shaped anode shield. The anode shield of the present invention is shown in FIG. 4 as elements 90 and 90' due to sectioning, but is a single ring and will be referred to hereinafter as anode shield 90. Anode shield 90 includes anode shield retaining threads, appearing as elements 92 and 92' due to sectioning, and hereinafter referred to as anode shield retaining threads 92. Anode shield retaining threads 92 are disposed about the interior circumference of anode shield 90 and threadably engage base plate threads appearing as elements 94 and 94' due to sectioning, and hereinafter referred to as base plate threads 94 disposed about the exterior circumference of base plate 96. Similar to the cathode shield, the distance between anode shield 90 and clamping ring 72 is fully adjustable simply by threading anode shield 90 to a greater or lesser degree along base plate 96. The anode shield retaining threads as shown in FIG. 4 as occupying only a portion of the interior circumference of anode shield 90, but it is to be understood that the threads may be turned as desired along the interior circumference of anode shield 90 to obtain as much adjustment as may be desired.

interposed between insulator plate 76 and base plate is an o-ring for sealing. The o-ring is shown in FIG. 4 as 98 and 98' due to sectioning, but it is simply the same o-ring and will be referred to hereinafter as o-ring 98. Insulator plate 76 is affixed to base plate 96 via a plurality of screws about the circumference of base plate 96, as represented by screws 100 and 102.

Electric current is supplied to electrode 70 via power cable 54 which provides a direct connection to cathode body 74 via screw 55. This is to be contrasted with the prior art in which the power connection was made to sealing plate 12 and then to cathode body 10. By directly coupling the power to the cathode body, the present invention eliminates the oxidation problems inherent in the prior art at the sealing plate 12/cathode body 10 interface.

Electrode 70 further includes ionizing gas inlet supply 104, in which ionizing gas is introduced in the interstitial space between target clamping ring 72 and anode shield 90. It is to be remembered that the entire electrode 70 is generally cylindrical (or linear) in form, and therefore the ionizing gas flowing through inlet 104 will flow along the direction indicated by arrows 106, flooding the surface of target 2 from all 360 degrees. Thus, unlike electrode 1 of the prior art, wherein the entire vacuum chamber in which the electrode is placed (not shown) had to be flooded with ionizing gas, the electrode 70 of the present invention permits the use of much less volumes of ionizing gas at lower pressures, because the gas flow is directed directly over the target 2.

Figure 5:
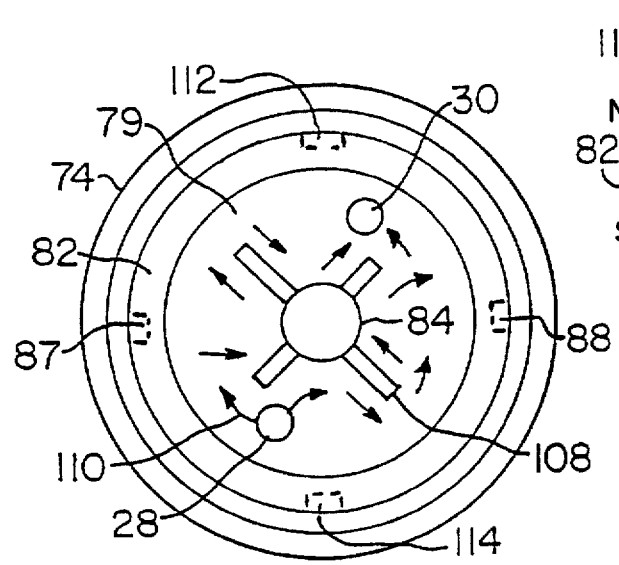
FIG. 5 is a sectional plan view of the water chamber of the present invention along the line B—B of FIG. 4.

FIG. 5 is a sectional plan view along the line B—B of FIG. 4 showing cathode body 74 and water chamber 78 formed therein. Ring magnet 82 and center magnet 84 respectively are shown within water chamber 78. Water enters water chamber 78 via water inlet supply 28 and exits via water outlet 30. However, unlike the prior art, the electrode 70 as shown in FIG. 5 further includes a plurality of water diverters, such as fins, 108 spaced along the circumference of center magnet 84. These diverters set up an extremely turbulent water flow in the water chamber 78 as indicated by the arrows 110 in FIG. 5. This turbulent flow, which is caused by the fins defining a flow path having varying cross section as shown in FIG. 5 allows the water to cool the target 2 more uniformly and more efficiently and avoids stress cracks in the target 2 from areas of intense heat buildup. Because of the more uniform and efficient cooling, higher forward powers can be applied to the electrode 70, permitting higher deposition rates. Also shown partially in phantom in FIG. 5 are spacers 86 and 88, as well as similar spacers 112 and 114.

Figure 6A:
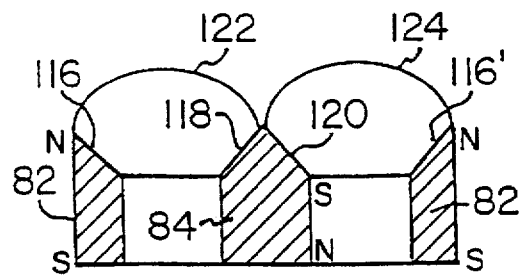
FIG. 6A is a sectional side view of the magnetic field flux lines of the magnet assembly of FIG. 5.
Figure 6B:
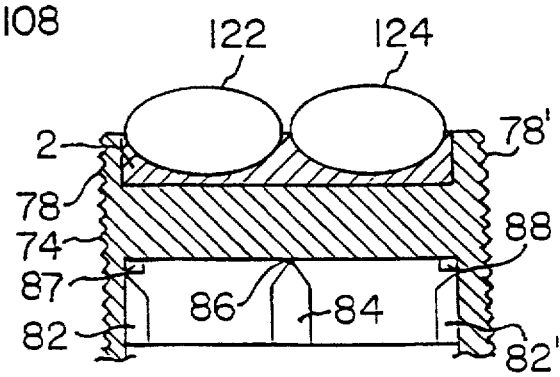
FIG. 6B is a sectional side view of the target utilization pattern which accompanies the field flux lines of FIG. 6A.

FIG. 6A is a sectional side view of the ring magnet 82 and center magnet 84. Because ring magnet 82 is shaped with inclined planes shown as elements 116 and 116' due to sectioning, and because center magnet 84 includes inclined planes 118 and 120 as those planes have been described above, the magnetic flux lines 122 and 124 can be designed to be markedly different than the magnetic flux lines 60 and 62 of prior art FIG. 3A. FIG. 6B provides a sectional side view similar to that of FIG. 6A, with the addition of target 2 and cathode body 74, cathode body threads 78 and spacers 86 and 88, and shows the improved erosion pattern of target 2 from the magnetic flux lines 122 and 124 produced by the shaped magnets 82 and 84. A comparison of FIG. 3B with FIG. 6B will show that the erosion pattern of the prior art was in the form of a very narrow valley or channel which would quickly wear through target 2 in a given area, requiring that target 2 be changed with great frequency. With the present invention, the erosion pattern produced in target 2 may be designed either to produce the narrow erosion pattern where high deposition rates are desired, or may be designed to produce a very wide, shallow valley, which permits the utilization of much more of target 2 before target 2 must be replaced. The shallow erosion pattern not only increases the amount of target 2 that can be utilized in the sputtering process and the life of target 2 because the erosion is not confined to a narrow valley, as in the prior art, but also extends the run time of the sputtering process because the process does not have to be stopped as often to replace target 2.

Figure 7:
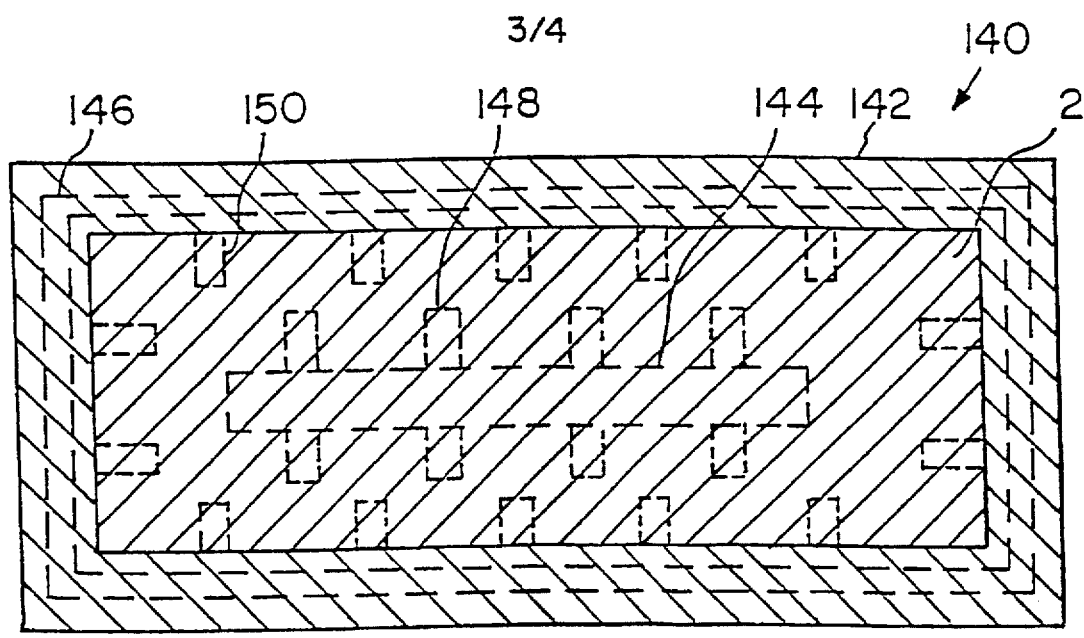
FIG. 7 is a sectional plan view of a linear electrode of the present invention.
Figure 8:
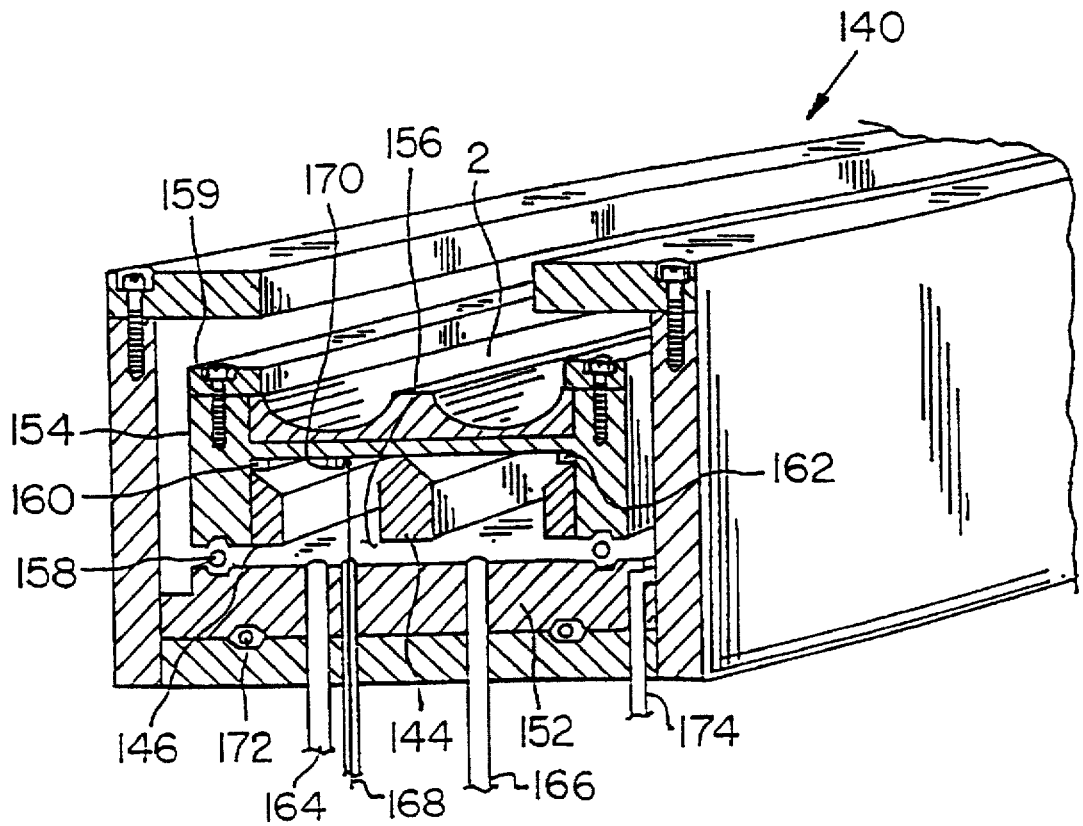
FIG. 8 is a sectional perspective view of a linear electrode of the present invention.

Referring now to FIG. 7, there is shown a sectional plan view of a linear electrode 140 of the present invention showing the target 2 surrounded by the anode shield 142. Also shown in FIG. 7 in phantom is center magnet 144 and perimeter magnet 146 also shown in phantom. A series of water diverters 148 extends perpendicularly from center magnet 144 within the water chamber which is behind target 2 in FIG. 7. Similarly, a plurality of water diverters 150, also shown in phantom, extend inwardly and generally perpendicularly from the wall of the water chamber of the electrode 140. FIG. 8 is a sectional perspective view of the linear electrode of the present invention. The water diverters or fins 148 and 150 set up the turbulent flow which provides uniform cooling in electrode 140 during operation. Electric current is supplied to cathode body 154 via power cable 168 which is retained to cathode body 154 via screw 170 as shown in FIG. 8. O-ring seal 172 functions in the same manner as o-ring seal 98 of FIG. 4. Gas inlet 174 as shown in FIG. 8 functions in the same manner as gas inlet 104 of FIG. 4 providing the same flow of process gas over the target 2 from all 360 degrees as described in connection with FIG. 4 above. Shown in FIG. 8 are center magnet 144 and perimeter magnet 146. As may be seen in FIG. 8, center magnet 144 has the same inclined plane as center magnet 84 of FIG. 4 and perimeter magnet 146 has the same incline plane as ring magnet 82 of FIG. 4. Insulator plate 152 and cathode body 154 cooperate to form water chamber 156 which is rendered watertight by o-ring seal 158. Target 2 is retained on cathode body 154 via target clamping ring 159. Spacers 160 and 162 function in the same manner as spacers 86 and 88 of FIG. 6B. Water inlet 164 and water outlet 166 function in the same manner as water inlet 28 and water outlet 30 of FIG. 4.

The turbulent water flow as shown in FIG. 5 provides improved cooling, allowing electrode 70 to function at higher powers with higher deposition rates without causing stress cracks in target 2. The direct power coupling of power cable 54 to the cathode body avoids the oxidation buildup and circuit degradation that was known with the prior art where power cable 54 was affixed to base plate 14 and the current was forced to flow to the cathode body over the interface of base plate 14 and water jacket 12.

The threaded clamping ring 72 and the threaded anode shield 90 eliminate the bulky clamping mechanisms shown in FIG. 1 in the prior art. The target 2 is affixed quickly and easily with the present invention, and various target thicknesses are easily accommodated by threading clamping ring 72 farther or lesser as required to accommodate a given target. By eliminating the bulky clamping mechanism and screw assemblies of the prior art, the electrode 70 of the present invention can be made much smaller for a given target size than those of the prior art. In addition, the threaded clamping ring 72 and anode shield 90 of the present invention eliminate the need for small screws which are difficult to start, easy to strip and easy to misplace. Further, threads 92 and 94 permit an infinitely adjustable anode shield-to-cathode shield spacing that was not possible with the prior art. Further still, anode shield 90 of the present invention eliminates welds which can cause fluctuations in the magnetic field. The smaller overall dimensions of electrode 70 permit closer proximity of electrode 70 to a substrate, which yields more uniform depositions on the substrate.

Gas inlet 104 provides ionizing gas directly over target 2 in electrode 70, which permits the use of lower gas pressures and lower gas volumes. Further, because less process gas is present, there are fewer process gas inclusions on the substrate during the deposition process resulting in better film uniformity.

Further, gas inlet 104 which provides gas over the surface of target 2 is of particular advantage in reactive sputtering. In many sputtering processes, the target material is sputtered without further physical or chemical reaction, and this may be termed "non-reactive sputtering". Targets capable of carrying current are often sputtered with direct current, also known as dc current, because dc current travels through the conductive material as opposed to over its surface. Radio frequency, or rf current, travels over the surface of a target, but can easily jump electrical boundaries, and therefore, while it will allow sputtering of non-conductive materials, it is not particularly widely used due to the fact that the current flow is somewhat more difficult to contain. A solution to sputter non-conducting targets is to use dc current and provide, in addition, a reactive gas, such as oxygen, which will react with the sputtered target material which is conductive. This is known as reactive sputtering. With reactive sputtering, a reactive gas over the target surface causes a physical or chemical reaction with the target material in the plasma such that the sputtered material reacts with the reactive gas before deposition on a substrate. Where a reactive gas is required, the present invention provides the additional benefit of providing the reactive gas directly over the target 2.

The use of solid ring magnet 82 as opposed to a plurality of individual magnets such as magnets 20 and 22, eliminates fluctuations in the magnetic field that occurred in the prior art between the various individual magnets. Elimination of these fluctuations permits a more uniform field and more target utilization. Importantly, the use of a solid ring magnet 82 eliminates the need for the use of a magnetic field shaping ring 18, as was required in the prior art, reducing the cost of producing the electrode 70 and reducing its bulk. Further, eliminating the shaping ring 18 permits a much closer target-to-magnet spacing than was heretofore known in the art. There is less secondary electron heating of the substrate and low pressure sputtering is facilitated. Importantly, elimination of the magnetic field shaping ring 18 permits the sputtering of targets which are themselves composed of magnetic materials but is not limited to magnetic foils as was the prior art. With the present invention, thicker magnetic target materials can be sputtered, which was not possible in the prior art where such magnetic field shaping rings were present.

Further, the use of shaped magnets 82 and 8 provides for controllable flux lines which offer the choice of more efficient target utilization and target life as shown in FIGS. 6A and 6B over the prior art, as shown in FIGS. 3A and 3B, or the use of higher deposition rates. In addition, where longer target life is chosen, longer process run times are now possible than have been known in the art which are accompanied by high sputtering rates.

Where the linear cathode of the present invention includes square or rectangular cathode shields and/or anode shields which preclude the threaded clamping ring 72 or the threaded anode shield 90, it is to be understood that the rectilinear cathode of the present invention will still include the advantages of the turbulent water flow from the water diverters and the advantages attendant with its more uniform cooling, the interchangeable magnets, the use of shaped magnets, the elimination of the magnetic shaping ring, the direct electrical contact with the cathode body, and the gas flow directly over the target surface.

EXAMPLES
Comparison of Deposition Rates

A comparison was made with respect to the prior art electrode and the electrode of the present invention as follows. A source-to-substrate distance of 4 inches was used for both electrodes, while applying 200 watts of dc power while using a two inch diameter target made of copper in an atmosphere of pure argon at 5 millitorr as a process gas. The deposition rate of the prior art electrode was 8 angstroms/second. The electrode of the present invention deposited at a rate of 11 angstroms/second.

Comparison of Target Utilizations

A comparison of target utilization was made with respect to the prior art electrode and the electrode of the present invention as follows. Two inch targets were utilized, each target being made of copper. The source-to-substrate distance was 4 inches. 100 watts of dc power was applied in an atmosphere of pure argon at 5 millitorr pressure. The targets were weighed and the weights recorded. The targets were then sputtered until burn through, and were then reweighed. The target utilization of the prior art electrode averaged 18% of the original weight. The present invention averaged 35% of the original weight.

Comparison of Film Uniformity

A comparison of film uniformity was made for both a static substrate and an rotary substrate utilizing 2 inch targets and 2 inch substrates. The atmosphere was pure argon at 3 millitorr. 100 watts of dc power was supplied for a run time of 10 minutes. The deposition rate was 6 angstroms/second. The source-to-substrate distance was 4 inches. Film uniformity was measured by masking ½ of each target before sputtering. After sputtering, the mask was removed and the sputtered and unsputtered portions of the target were compared with a profile meter. For the static substrate, the variation in film uniformity for the prior art electrode was ±5% across the surface of the substrate, whereas the variation in film uniformity for the present invention was only ±3%. For the rotary substrate, the variation in film uniformity for the prior art electrode was ±3% across the substrate while the electrode of the present invention was only ±1%.

Comparison of Magnetic Field Strength at Target Surface

A comparison of the magnetic field strength at the target surface was made for the electrode of the present invention and the prior art electrode as follows. The target was 2 inches in diameter and made of aluminum and was 0.125 inches thick. Without applying power, field strength was measured on a lab bench at ambient temperature. Measurements of field strength were made using an axial probe gauss meter. The magnetic field strength at the target surface of the prior art was on the order of 300 to 500 gauss. The magnetic field strength of the present invention was 700 to 900 gauss.

Comparison of Operating Pressure

Operating pressure is linked to magnetic field strength. The stronger the magnetic field at the surface of the target, the more gaseous ions are trapped within the field. A certain quantum of gaseous ions are required within the field for sputtering to occur. If too many gaseous ions escape the field during sputtering, sputtering will be extinguished. Therefore, stronger field strengths permit the electrode to operate at lower pressures of operating gas, because all or nearly all of the ions present are retained within the magnetic field, allowing sputtering to continue longer as the operating gas pressure decreases. A comparison of operating pressures was made as follows. Two inch targets were selected. The atmosphere was pure argon. Sputtering was extinguished in the prior art electrode at 2 millitorr, whereas the electrode of the present invention continued to operate at 0.1 millitorr.

Comparison of Target Cooling Uniformity

A comparison of the uniformity of the cooling of the target was made between the electrode of the prior art and the electrode of the present invention as follows. Using an eight point temperature measurement spaced about the circumference of the surface of the target, it was found that the prior art suffered a 32% variation in target cooling uniformity over its surface, whereas the present invention suffered only a 2% variation.

Comparison of Multi-Electrode Minimum Spacing

A comparison was made of the minimum area needed to accommodate three electrodes, each utilizing targets two inches in diameter, for multi-electrode deposition sputtering. With the bulky clamping mechanisms of the prior art, the minimum circle that would accommodate the prior art's three electrodes was an 8" diameter circle. The present invention accomplished the use of three electrodes in a 6" diameter circle.

While the invention has been described with regard to specific embodiments, those skilled in the art will recognize that changes can be made in form and detail without departing from the spirit and scope of the invention. It is to be understood that the descriptions and examples are intended to illustrate and not limit the scope of the invention, which is defined by the scope of the appended claims.

What is claimed is:

1. A magnetron sputtering electrode for use within a magnetron sputtering device, said magnetron sputtering electrode, comprising:

a threaded cathode body;

a threaded target retainer threadably engaged to said cathode body and defining a target receiving recess having a depth;

an insulator plate secured to said cathode body;

said insulator plate and said cathode body defining a magnet receiving chamber;

a plurality of magnets received within said magnet receiving chamber, wherein each of said magnets containing a tip having an apex, wherein said apexes are positioned adjacent a target supporting surface of said cathode body, said magnets cooperating to generate magnetic flux lines which form a closed-loop magnetic tunnel adjacent to a front sputtering surface of the target;

a threaded base plate secured to said insulator plate;

a fluid inlet and a fluid outlet fluidly coupled to said magnet receiving chamber;

a plurality of diverters positioned within said magnet receiving chamber, said diverters defining a fluid flow path that has a varying cross section so as to turbulently mix fluid passing through the magnet receiving chamber; and an anode shield threadably secured to said threaded base plate, said anode shield surrounds and contains said cathode body and said insulator plate, whereby turning said target retainer relative to said threaded cathode body varies the depth of the target receiving recess so that targets of varying thicknesses can be received within the target receiving recess, and a distance between said anode shield and said target retainer is threadably adjustable by turning said anode shield relative to said target retainer.

2. A magnetron sputtering electrode as claimed in claim 1, further comprising a target received within the target receiving recess, wherein said target retainer and said cathode body contact said target.

3. A magnetron sputtering electrode as claimed in claim 1, wherein said diverters are fins.

4. A magnetron sputtering electrode as claimed in claim 1, wherein one of said magnets defines a hollow center and the other of said magnets is positioned within said hollow center.

5. The electrode of claim 1, further comprising a gas inlet adapted to permit a process gas to be introduced through a gas inlet into an interstitial space defined between the anode shield and the cathode shield and adapted to permit a process gas to flow over a surface of a target from the interstitial space.

6. The electrode of claim 1, further comprising a power cable affixed directly to said cathode body.

7. A magnetron sputtering electrode as claimed in claim 1, wherein a cross section of each of said tips defines a line that extends from said apex.

8. A magnetron sputtering electrode as claimed in claim 7, wherein said line is an inclined straight line.

9. A magnetron sputtering electrode as claimed in claim 7, wherein said line is curved.

10. A magnetron sputtering electrode as claimed in claim 9, wherein said line is convex-shaped.

11. A magnetron sputtering electrode as claimed in claim 9, wherein said line is concave-shaped.

12. A magnetron sputtering electrode as claimed in claim 1, wherein said magnets are removable.

13. A magnetron sputtering electrode as claimed in claim 1, wherein one of said magnets is cylindrical-shaped and the other of said magnets is annular-shaped.

14. The electrode of claim 1, wherein said target comprises a magnetic materials.

15. The electrode of claim 1, wherein the electrode is used within a reactive magnetron sputtering device.

16. The electrode of claim 1, wherein the electrode is used within a non-reactive magnetron sputtering device.

17. The electrode of claim 1, wherein the electrode is used within a balanced magnetron sputtering device.

18. The electrode of claim 1, wherein the electrode is used within an unbalanced magnetron sputtering device.

19. A magnetron sputtering electrode for use within a magnetron sputtering device for coating a substrate with a material sputtered from a target composed of the material, the electrode comprising:

a circular target, the target having a front sputtering surface, a body and a back surface;

an annular cathode body located adjacent the back surface of the target, the cathode body including a target supporting surface and threads on the exterior surface of the cathode body;

an annular clamping ring including threads on the interior surface of the clamping ring, wherein the clamping ring retains the target adjacent the cathode body by threadably engaging the interior threads of the clamping ring with the exterior threads of the cathode body, wherein the clamping ring functions as a cathode shield;

a circular insulator plate, the insulator plate having a front surface, a body and a back surface, wherein the cathode body cooperates with the front surface of the insulated plate to form a watertight water chamber, wherein the water chamber includes a top and sides bounded by the cathode body and a bottom bounded by the insulator plate;

a first annular magnet within the water chamber;

a second cylindrical magnet within the water chamber, wherein the second magnet is a center magnet and is disposed within the perimeter of the first magnet, each of said magnets containing a tip having an apex, wherein said apexes are positioned adjacent said target supporting surface of said cathode body, the first and second magnets cooperating to generate magnetic flux lines which form a closed-loop magnetic tunnel adjacent the front sputtering surface of the target;

a circular base plate adjacent the back surface of the insulator plate, wherein the base plate is electrically insulated from the cathode body by the insulator plate, the base plate further including threads on the exterior surface of the base plate;

an annular anode shield associated with the base plate, wherein the anode shield includes threads on the interior surface of the anode shield and wherein the anode shield is associated with the base plate by threadably engaging the threads on the interior surface of the anode shield with the exterior threads on the base plate, wherein the anode shield surrounds and contains within the anode shield the target, the cathode shield, the cathode body, the water chamber and the insulator plate;

a water inlet for introducing cooling water into the water chamber;

a water outlet for removing cooling water from the water chamber, wherein the water inlet and the water outlet cooperate to permit a constant flow of cooling water within the water chamber; and a plurality of water diverters within the water chamber, wherein the water diverters provide a turbulent water flow within the water chamber which in turn provides uniform cooling of the target, wherein the threadable engagement of the clamping ring and the cathode body permits infinite adjustment within the range of the threads to accommodate targets of varying thicknesses and the threadable engagement of the anode shield and the base plate permits infinite adjustment within the range of the threads of an anode to cathode spacing between the anode shield and the cathode shield.

20. A magnetron sputtering electrode for use within a magnetron sputtering device, said magnetron sputtering electrode, comprising:

a cathode body;

a target retainer engaged to said cathode body and defining a target receiving recess having a thickness;

an insulator plate secured to said cathode body;

said insulator plate and said cathode body defining a magnet receiving chamber;

a base plate secured to said insulator plate;

an anode shield secured to said base plate, said anode shield surrounds and contains said cathode body and said insulator plate;

a fluid inlet and a fluid outlet fluidly coupled to said magnet receiving chamber;

a plurality of diverters positioned within said magnet receiving chamber, said diverters defining a fluid flow path that has a varying cross section so as to turbulently mix fluid passing through the magnet receiving chamber; and said magnetic receiving chamber receives a plurality of magnets, each containing a tip having an apex, wherein said apexes are positioned adjacent a target supporting surface of said cathode body, said magnets cooperating to generate magnetic flux lines which form a closed-loop magnetic tunnel adjacent to a front sputtering surface of the target.

21. A magnetron sputtering electrode as claimed in claim 20, further comprising a target received within the target receiving recess, wherein said target retainer and said cathode body contact said target.

22. A magnetron sputtering electrode as claimed in claim 20, wherein said diverters are fins.

23. A magnetron sputtering electrode as claimed in claim 20, wherein a cross section of each of said tips defines a line that extends from said apex.

24. A magnetron sputtering electrode as claimed in claim 23, wherein said line is an inclined straight line.

25. A magnetron sputtering electrode as claimed in claim 21, wherein said target is circular-shaped.

26. A magnetron sputtering electrode as claimed in claim 21, wherein said target is rectangular-shaped.

27. A magnetron sputtering electrode as claimed in claim 1, wherein said magnets are interchangeable.

* * * * *

UNITED STATES PATENT AND TRADEMARK OFFICE
CERTIFICATE OF CORRECTION

PATENT NO. : 5,736,019  
DATED : April 7, 1998  
INVENTOR(S) : Mark A. Bernick

Page 1 of 13

It is certified that error appears in the above-identified patent and that said Letters Patent is hereby corrected as shown below:

Column 1 between Lines 1 and 2, insert --BACKGROUND OF THE INVENTION--.

Column 1 Line 7 after "particularly" delete "still" and insert comma --,--.

Column 1 Line 66 after "plate" delete comma --,--.

Column 2 Line 1 between "of" and "base" insert --the--.

Column 2 Line 1 between "and" and "sidewall" insert --the--.

Column 2 Line 2 "o-ring" should read --O-ring--.

Column 2 Line 9 after "prior art" insert comma --,--.

Column 2 Line 39 after "operation" delete comma --,--.

Column 2 Lines 53-54 after "doing so" delete comma --,--.

Column 2 Line 54 after "target area" delete comma --,--.

Column 2 Lines 65-66 after "plasma density" insert comma --,--.

Column 2 Line 66 after "supplied" delete comma --,--.

Column 3 Line 13 between "materials" and "such" insert comma --,--.

Column 3 Line 14 after "and the like" insert comma --,--.

Column 3 Line 30 after "area" delete comma --,--.

Column 3 Line 61 after "thicknesses" insert comma --,--.

UNITED STATES PATENT AND TRADEMARK OFFICE
CERTIFICATE OF CORRECTION

PATENT NO. : 5,736,019
DATED : April 7, 1998
INVENTOR(S) : Mark A. Bernick

It is certified that error appears in the above-identified patent and that said Letters Patent is hereby corrected as shown below:

Column 3 Line 62 after "materials" insert comma --,--.

Column 5 Line 7 "gas f lows" should read --gas flows--.

Column 5 Line 63 before "insulator" delete "said" and insert --the--.

Column 6 Line 11 after "adjacent to" delete "said" and insert --the--.

Column 6 Line 13 after "back surface of" insert --the--.

Column 6 Line 30 after "target;" insert --and--.

Column 6 Lines 31-32 after "cathode body" delete "; and" and insert comma --,--.

Column 6 Line 44 after "surface of" delete "said" and insert --the--.

Column 6 Line 46 before "clamping ring" delete "said" and insert --the--.

Column 6 Line 50 between "wherein" and "clamping" insert --the--.

Column 6 Line 53 before "insulator" delete "said" and insert --the--.

Column 6 Line 67 before "front" delete "said" and insert --the--.

Column 7 Line 27 after "target;" insert --and--.

UNITED STATES PATENT AND TRADEMARK OFFICE
CERTIFICATE OF CORRECTION

PATENT NO. : 5,736,019
DATED : April 7, 1998
INVENTOR(S) : Mark A. Bernick

It is certified that error appears in the above-identified patent and that said Letters Patent is hereby corrected as shown below:

Column 7 Lines 28-29 after "body" delete "; and" and insert comma --,--.

Column 7 Line 36 after "prior art" insert --taken--.

Column 7 Line 36 after "along" delete --the--.

Column 7 Line 36 after "line" delete "A-A" and insert --II-II--.

Column 7 Line 45 after "invention" insert --taken--.

Column 7 Line 45 after "along" delete --the--.

Column 7 Line 45 after "line" delete "B-B" and insert --V-V--.

Column 7 Line 49 before "field" insert --magnetic--.

Column 7 Line 64 delete "numeral" and insert --numerals--.

Column 8 Line 13 after "Fig. 1" delete "the" and insert --an--.

Column 8 Line 14 after "includes" insert --a--.

Column 8 Line 27 before "seal" delete "water tight" and insert --watertight--.

Column 8 Line 27 delete "o-ring" and insert --O-ring--.

Column 8 Line 30 delete "o-ring" and insert --O-ring--.

Column 8 Line 44 after "magnetic" insert --field--.

Column 8 Line 48 after "magnetic" insert --field--.

Column 8 Line 53 after "magnetic" insert --field--.

UNITED STATES PATENT AND TRADEMARK OFFICE
CERTIFICATE OF CORRECTION

PATENT NO. : 5,736,019
DATED : April 7, 1998
INVENTOR(S) : Mark A. Bernick

It is certified that error appears in the above-identified patent and that said Letters Patent is hereby corrected as shown below:

Column 8 Line 61 after "via" insert --a--.

Column 8 Line 62 after "via" insert --a--.

Column 9 Line 8 "interposed" should read --Interposed--.

Column 9 Lines 10-11 delete "water tight" and insert --watertight--.

Column 9 Line 12 delete "o-ring" and insert --O-ring--.

Column 9 Line 12 after "interposed" delete "between" and insert --therebetween--.

Column 9 Line 14 delete "o-ring" and insert --O-ring--.

Column 9 Line 17 before "screw" insert --a--.

Column 9 Line 20 delete "o-ring" and insert --O-ring--.

Column 9 Line 30 before "magnet" insert --a--.

Column 9 Line 30 after "assembly" insert --taken--.

Column 9 Line 31 after "along" delete --the--.

Column 9 Line 31 after "line" delete "A-A in" and insert --II-II of--.

Column 9 Line 31 after "magnetic" insert --field--.

Column 9 Line 32 after "phantom" delete "are" and insert --is--.

Column 9 Line 35 after "inlet" insert --supply--.

UNITED STATES PATENT AND TRADEMARK OFFICE
CERTIFICATE OF CORRECTION

PATENT NO. : 5,736,019
DATED : April 7, 1998
INVENTOR(S) : Mark A. Bernick

It is certified that error appears in the above-identified patent and that said Letters Patent is hereby corrected as shown below:

Column 9 Line 39 after "placement of" insert --a--.

Column 9 Line 41 after "prior" delete "art's" and insert --art--.

Column 9 Line 47 after "prior" delete "art's" and insert --art--.

Column 9 Line 51 before "electrode" delete "the" and insert --an--.

Column 9 Line 60 after "against" insert --a--.

Column 10 Line 12 "plate 76" should read --plate 77--.

Column 10 Line 13 between "form" and "water" insert --a--.

Column 10 Line 14 "chamber 78" should read --chamber 79--.

Column 10 Line 14 "water tight" should read --watertight--.

Column 10 Line 14 "o-ring" should read --O-ring--.

Column 10 Line 15 "o-ring" should read --O-ring--.

Column 10 Line 17 after "single" delete "o-ring" and insert --O-ring--.

Column 10 Line 18 "o-ring 80" should read --O-ring 80--.

Column 10 Line 19 "chamber 78" should read --chamber 79--.

Column 10 Line 24 "chamber 78" should read --chamber 79--.

UNITED STATES PATENT AND TRADEMARK OFFICE
CERTIFICATE OF CORRECTION

PATENT NO. : 5,736,019
DATED : April 7, 1998
INVENTOR(S) : Mark A. Bernick

It is certified that error appears in the above-identified patent and that said Letters Patent is hereby corrected as shown below:

Column 10 Line 25 before "center magnet" insert --a--.

Column 10 Line 26 before "magnet 86" insert --a--.

Column 10 Line 59 after "magnet" insert --82--.

Column 10 Line 64 "which required" should read --which requires--.

Column 11 Line 22 "Also" should read --As--.

Column 11 Line 22 "FIG. 4" should read --FIG. 5--.

Column 11 Line 22 "chamber 78" should read --chamber 79--.

Column 11 Line 23 "spacers 86" should read --spacers 87--.

Column 11 Line 26 after "magnetic" insert --field--.

Column 11 Line 29 "Electrode 70" should read --Referring back to FIG. 4, electrode 70--.

Column 11 Line 40 before "base plate" insert --a--.

Column 11 Line 45 after "retaining threads" delete "as" and insert --92 is--.

Column 11 Line 50 "interposed" should read --Interposed--.

Column 11 Line 50 "insulator plate 76" should read --insulator plate 77--.

Column 11 Line 50 after "base plate" insert --96--.

UNITED STATES PATENT AND TRADEMARK OFFICE
CERTIFICATE OF CORRECTION

PATENT NO. : 5,736,019
DATED : April 7, 1998
INVENTOR(S) : Mark A. Bernick

It is certified that error appears in the above-identified patent and that said Letters Patent is hereby corrected as shown below:

Column 11 Line 51, two occurrences, "o-ring" should read --O-ring--.

Column 11 Line 52, "o-ring" should read --O-ring--.

Column 11 Line 53, "o-ring 98" should read --O-ring 98--.
Column 11 Line 53, "Insulator plate 76" should read --Insulator plate 77--.

Column 11 Line 58 "cable 54" should read --cable 50--.

Column 11 Line 59 before "screw" insert --a--.

Column 11 Line 66 after "includes" insert --an--.

Column 12 Line 1 after "between" delete --target--.

Column 12 Line 4 after "through" delete "inlet" and insert --ionizing gas inlet supply--.

Column 12 Line 13 after "view" insert --taken--.

Column 12 Line 13 after "along" delete --the--.

Column 12 Line 13 after "line" delete "B-B" and insert --V-V--.

Column 12 Line 14 "chamber 78" should read --chamber 79--.

Column 12 Line 16 "chamber 78" should read --chamber 79--.

Column 12 Line 17 "chamber 78" should read --chamber 79--.

Column 12 Line 21 delete "These" and insert --The water--.

UNITED STATES PATENT AND TRADEMARK OFFICE
CERTIFICATE OF CORRECTION

PATENT NO. : 5,736,019
DATED : April 7, 1998
INVENTOR(S) : Mark A. Bernick

It is certified that error appears in the above-identified patent and that said Letters Patent is hereby corrected as shown below:

Column 12 Line 21 after "diverters" insert --108--.

Column 12 Line 22 "chamber 78" should read --chamber 79--.

Column 12 Line 23 after "by" delete --the--.

Column 12 Line 25 "cross section" should read --cross sections--.

Column 12 Line 25 after "FIG. 5" insert comma --,--.

Column 12 Line 31 "spacers 86" should read --spacers 87--.

Column 12 Line 38 after "above" delete --the--.

Column 12 Line 43 "spacers 86" should read --spacers 87--.

Column 12 Line 64 after "surrounded by" delete "the" and insert --an--.

Column 12 Line 65 before "center" insert --a--.

Column 12 Line 66 between "and" and "perimeter" insert --a--.

Column 13 Line 4 before "electrode" insert --linear--.

Column 13 Line 6 after "electrode" insert --140--.

Column 13 Line 8 before "electrode" insert --linear--.

Column 13 Line 9 before "cathode" insert --a--.

Column 13 Line 9 between "via" and "power" insert --a--.

UNITED STATES PATENT AND TRADEMARK OFFICE
CERTIFICATE OF CORRECTION

PATENT NO. : 5,736,019
DATED : April 7, 1998
INVENTOR(S) : Mark A. Bernick

It is certified that error appears in the above-identified patent and that said Letters Patent is hereby corrected as shown below:

Column 13 Line 10 after "retained to" insert --the--.

Column 13 Line 10 between "via" and "screw" insert --a--.

Column 13 Line 11 "O-ring seal" should read --An O-ring--.

Column 13 Line 12 "as o-ring seal 98" should read --as O-ring 98--.

Column 13 Line 12 delete "Gas" and insert --A gas--.

Column 13 Line 13 after "manner as" delete "gas inlet" and insert --ionizing gas inlet supply--.

Column 13 Line 19 delete "Insulator" and insert --An insulator--.

Column 13 Line 20 after "form" insert --a--.

Column 13 Line 21 "o-ring" should read --An O-ring--.

Column 13 Line 22 after "via" insert --a--.

Column 13 Line 24 "86 and 88" should read --87 and 88--.

Column 13 Line 24 after "FiG. 6B." delete "Water" and insert --A water--.

Column 13 Line 24 after "outlet" insert --supply--.

Column 13 Line 25 after "inlet" insert --supply--.

Column 13 Line 32 "cable 54" should read --cable 50--.

UNITED STATES PATENT AND TRADEMARK OFFICE
CERTIFICATE OF CORRECTION

PATENT NO. : 5,736,019
DATED : April 7, 1998
INVENTOR(S) : Mark A. Bernick

It is certified that error appears in the above-identified patent and that said Letters Patent is hereby corrected as shown below:

Column 13 Line 32 after "cathode body" insert --74--.

Column 13 Line 34 "cable 54" should read --cable 50--.

Column 13 Line 34 "base plate 14" should read --base plate 40--.

Column 13 Line 35 after "cathode body" insert --10--.

Column 13 Line 36 "base plate 14" should read --base plate 40--.

Column 13 Line 36 after "and" delete "water jacket" and insert --sealing plate--.

Column 13 Line 39 after "Fig. 1" delete "in" and insert --of--.

Column 13 Line 58 before "104" "Gas inlet" should read --Ionizing gas inlet supply--.

Column 13 Line 64 after "Further," delete "gas inlet" and insert --ionizing gas inlet supply--.

Column 14 Line 22 after "individual magnets" insert comma --,--.

Column 14 Line 30 after "eliminating the" insert --magnetic field--.

Column 14 Line 41 "82 and 8" should read --82 and 84--.

Column 14 Line 67 "two" should read --2--.

Column 15 Line 10 delete "100" and insert --One hundred--.

Column 15 Line 18 "an rotary" should read --a rotary--.

UNITED STATES PATENT AND TRADEMARK OFFICE
CERTIFICATE OF CORRECTION

PATENT NO. : 5,736,019
DATED : April 7, 1998
INVENTOR(S) : Mark A. Bernick

It is certified that error appears in the above-identified patent and that said Letters Patent is hereby corrected as shown below:

Column 15 Line 20 delete "100" and insert --One hundred--.

Column 16 Line 2 after "targets" delete "two" and insert --2--.

Claim 14 Column 17 Line 17 "materials" should read --material--.

UNITED STATES PATENT AND TRADEMARK OFFICE
CERTIFICATE OF CORRECTION

PATENT NO.  : 5,736,019

DATED       : 04/07/98

INVENTOR(S) : Mark A. Bernick

It is certified that error appears in the above-identified patent and that said Letters Patent is hereby corrected as shown below:

Col. 2, line 57, after "area" delete ",".
Col. 3, line 23, after "strength" delete ",".
Col. 3, line 23, after "and" insert --;--.
Col. 3, line 23, after "therefore", insert -- , --.

Col, 3, line 67, after "for sputtering" insert --, --.
Col. 4, line 46, after "Particularly" insert --,--.
Col. 5, line 3, after "provided" delete ",".
Col. 5, line 14, after "structure" delete ",".
Col. 5, line 25, after "valley" delete ",".
Col. 5, line 26, after "utilized" delete ",".
Col. 8, line 25, after "8" insert ",".
Col. 8, line 25, after "respectively" insert --,--.
Col. 8, line 36, after "manufacture" delete ",".
Col. 9, line 4, after "38" insert --,--.
Col. 9, line 6, after "44" insert --,--.
Col . 9, line 33, after "22" delete ",".
Col. 10, line 58, after "invention" delete ",".
Col. 11, line 2, after "art" delete ",".
Col. 12, line 11, after "pressures" delete ",".
Col. 12, line 15, after "magnet 84" insert --,--.
Col. 12, line 16, after "respectively" insert --,--.
Col. 12, line 19, after "70" insert --,--.

UNITED STATES PATENT AND TRADEMARK OFFICE
CERTIFICATE OF CORRECTION

PATENT NO.  : 5,736,019

DATED       : April 7, 1998

INVENTOR(S) : Mark A Bernick

It is certified that error appears in the above-identified patent and that said Letters Patent is hereby corrected as shown below:

Col. 12, line 19, after "5" insert --,--.
Col. 12, line 29, after "70" delete --,--.
Col. 12, line 41, after "6A" delete ",".
Col. 12, line 66, after "146" insert --,--.

Col. 13, line 25, after "164 and" insert --a--.
Col. 13, line 28, after "flow" insert --,--.
Col. 12, line 28, after "Fig. 5" insert --,--.
Col. 13, line 29, after "cooling" delete ",".
Col. 13, line 64, after "104" insert --,--.
Col. 13, line 65, after "2" insert --, --.

Signed and Sealed this

Twenty-seventh Day of April, 1999

Attest:

Q. TODD DICKINSON

Attesting Officer

Acting Commissioner of Patents and Trademarks